United States Patent [19]
Okanobu

[11] Patent Number: 4,933,972
[45] Date of Patent: Jun. 12, 1990

[54] STEREO MULTIPLEX DEMODULATOR

[75] Inventor: Taiwa Okanobu, Tokyo, Japan

[73] Assignee: Sony Corporation, Tokyo, Japan

[21] Appl. No.: 371,110

[22] Filed: Jun. 26, 1989

[30] Foreign Application Priority Data

Jun. 28, 1988 [JP] Japan ................................ 63-159933

[51] Int. Cl.⁵ .............................................. H04H 5/00
[52] U.S. Cl. ...................................................... 381/4
[58] Field of Search ......................... 381/2, 3, 4, 7, 13

[56] References Cited

U.S. PATENT DOCUMENTS

| | | | |
|---|---|---|---|
| 4,164,624 | 8/1979 | Ogita | 381/7 |
| 4,399,324 | 8/1983 | Ishida et al. | 381/3 |
| 4,539,697 | 9/1985 | Ishida et al. | 381/7 |
| 4,817,150 | 3/1989 | Filliman | 381/7 |

Primary Examiner—Forester W. Isen
Attorney, Agent, or Firm—Alvin Sinderbrand

[57] ABSTRACT

A composite stereo signal comprised of a modulated signal modulated by a sum signal which is the sum of left and right channel audio signals and a difference signal which is the difference between the left and right channel audio signals, and a pilot signal synchronized with the modulated signal, has the left and right channel audio signals demodulated therefrom by a stereo multiplex demodulator that includes a phase-locked loop (PLL) circuit for forming a sine wave signal synchronized with the pilot signal and having a frequency equal to a subcarrier frequency of the modulated signal, and a multiplying circuit for multiplying the composite stereo signal and the sine wave signal to generate the demodulated left and right channel audio signals.

3 Claims, 4 Drawing Sheets

STEREO MULTIPLEX DEMODULATOR

BACKGROUND OF THE INVENTION

1. Field of the Invention

The present invention relates to a stereo multiplex demodulator which is suitable for application to an FM stereo receiver and the like.

2. Description of the Prior Art

In present FM stereo broadcasting, a main carrier signal is frequency-modulated by a composite stereo signal Sc which is expressed as $Sc = Sm + Ss + Sp$
$Sm = L + R$
$Ss = (L - R) \sin \omega t$
$Sp = k \sin \omega t/2$ ... pilot signal
L : left=channel audio signal
R : right-channel audio signal
$\omega : 2\pi f t$
f : 38 kHz ... subcarrier frequency
k : constant Therefore, in the FM receiver, a switching signal synchronized with the pilot signal Sp is generated with the frequency f, and this switching signal is used to switch the composite signal Sc, thereby demodulating the signals L and R.

When the stereo signals are demodulated by switching as described above, the switching signal is a rectangular wave signal, and contains a higher harmonic component of an odd-numbered order. Further, the composite signal Sc contains a higher harmonic component due to the non-linearity of the signal system, and it is frequently observed that the composite signal Sc contains a beat frequency component for the adjacent channel and an intermediate frequency signal component.

Thus, when the stereo signals are demodulated, an undesired signal component contained in the composite signal Sc is switched by the higher harmonic component of the switching signal so that the stereo demodulated output contains a beat interference component caused by the undesired signal component in addition to the original signals L and R.

In some FM receivers, the composite signal Sc is supplied to a low-pass filter to thereby remove the undesired signal component contained in the composite signal Sc. However, such low-pass filter needs to have a steep cut-off characteristic, which results in increased cost. Further, when the composite signal Sc is processed by the low-pass filter, the phase and the frequency characteristic of the composite signal are affected by the low-pass filter, with the result that distortion is increased and the separation is made less effective.

It has also been proposed that the composite signal Sc be switched only by the higher harmonic component of the switching signal, and that the beat interference component contained in the original stereo demodulated output be canceled by the switched output. However, for this proposal to achieve its desired results, the level of the beat interference component used to cancel the beat interference component must accurately coincide with that of the beat interference component contained in the stereo demodulated output. Therefore, strict or very accurate adjustment is needed.

OBJECTS AND SUMMARY OF THE INVENTION

Accordingly, it is an object of the present invention to provide an improved stereo multiplex demodulator which avoids the above noted problems of the prior art.

More specifically, it is an object of the present invention to provide a stereo multiplex demodulator which can provide a stereo demodulated output which is devoid of any interference component.

It is another object of the present invention to provide a stereo multiplex demodulator which can provide a stereo demodulated output free of any cross-talk component.

It is still another object of the present invention to provide a stereo multiplex demodulator, as aforesaid, which can be suitably fabricated as an integrated circuit.

It is a further object of the present invention to provide a stereo multiplex demodulator which is excellently adapted for mass-production.

According to an aspect of the present invention, left and right channel audio signals are demodulated from a stereo composite signal comprised of a modulated signal modulated by a signal which is the sum of left and right channel audio signals and a signal which is the difference between the left and right channel audio signals, and a pilot signal synchronized with the modulated signal, by a stereo multiplex demodulator comprising: a phase-locked loop (PLL) circuit for forming a sine wave signal synchronized with the pilot signal and having a frequency equal to a subcarrier frequency of the modulated signal; and a multiplying circuit for multiplying the stereo composite signal and the sine wave signal so as to generate the demodulated left and right channel audio signals.

The above, and other objects, features and advantages of the present invention, will be apparent in the following detailed description of a preferred embodiment of the invention when read in conjunction with the accompanying drawings, in which like reference numerals are used to identify the same or similar parts in the several views.

BRIEF DESCRIPTION OF THE DRAWINGS

FIG. 4 is a schematic diagram of voltage levels to which reference will be made in explaining the operation of the stereo multiplex demodulator according to the present invention,

DETAILED DESCRIPTION OF A PREFERRED EMBODIMENT

Figure 1:
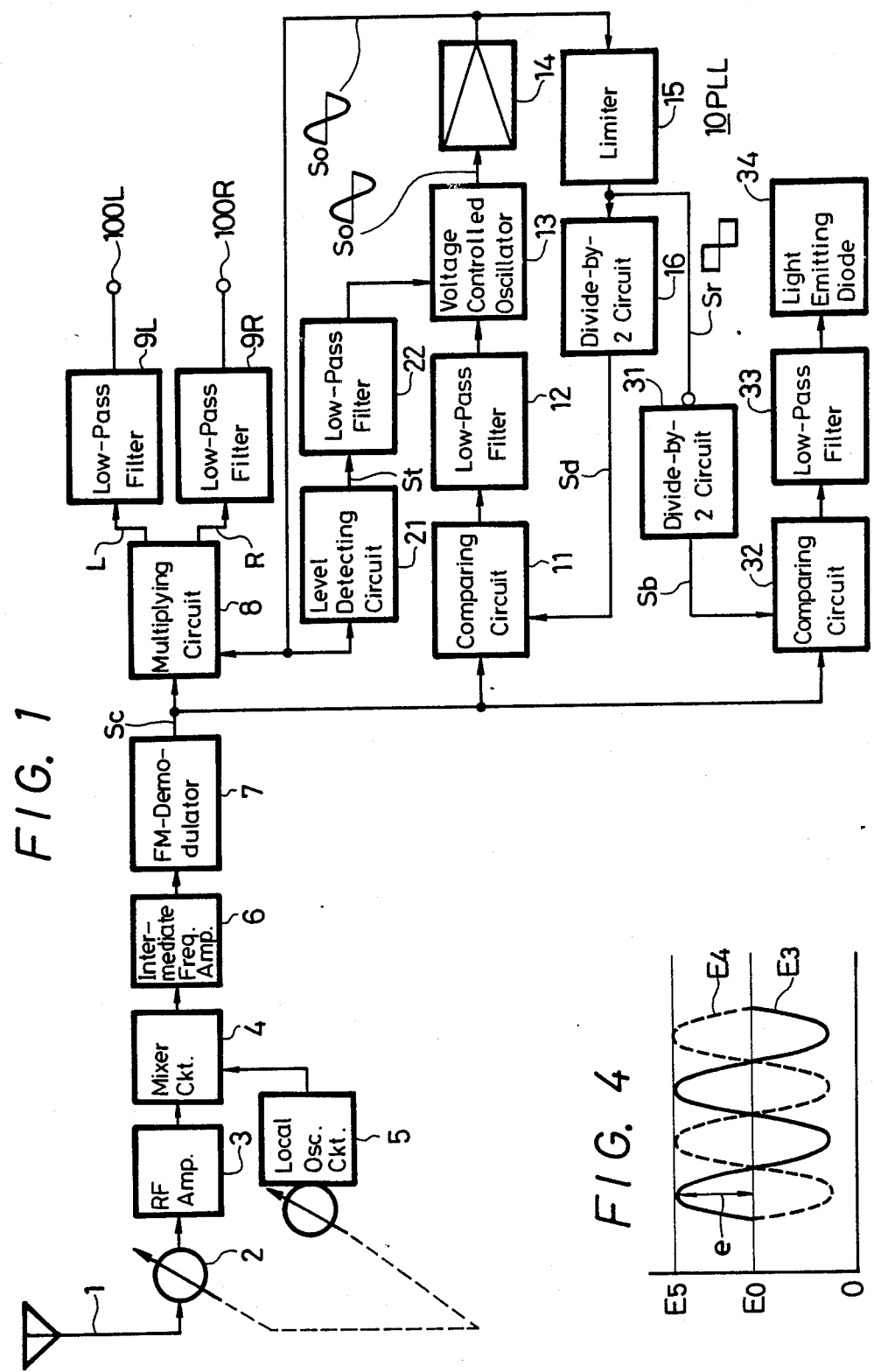
FIG. 1 is a block diagram showing a receiver including a stereo multiplex demodulator according to an embodiment of the present invention.

A stereo multiplex demodulator according to an embodiment of the present invention is shown in FIG. 1, incorporated in an FM receiver which generally comprises an antenna 1 having an antenna tuning circuit 2 connected thereto, a radio (high) frequency amplifier 3 connected to the tuning circuit 2, a mixer circuit 4 and a local oscillating circuit 5. An FM broadcast signal having a frequency selected by the tuning circuit 2 is frequency-converted by the mixer circuit 4 to an intermediate frequency signal having a frequency of, for example, 10.7 MHz, on the basis of a local oscillation signal from the local oscillating circuit 5. The intermediate frequency signal is supplied from the mixer circuit 4 through an intermediate frequency amplifier 6 to an FM-demodulator circuit 7, in which it is demodulated to a composite stereo signal Sc. The composite stereo signal Sc is supplied to a multiplying circuit 8.

The composite stereo signal Sc is also supplied to a phase comparing circuit 11 which forms part of a phase locked loop (PLL) circuit 10. More specifically, a voltage-controlled oscillator (VCO) 13 generates an oscillation signal So of sine waveform having a free running frequency f. This signal So is supplied through a buffer amplifier 14 to a limiter 15, in which it is converted to a rectangular wave signal Sr. The signal Sr is supplied to a frequency dividing circuit or a divide-by-2 circuit 16, in which it is divided to provide a rectangular wave signal Sd which inverts its polarity in response to each leading edge of the signal Sr, or the signal Sd is synchronized with the leading edge of the signal Sr (a zero-cross point at which the signal So changes from the negative level to the positive level) and the signal Sd has a frequency f/2. This signal Sd is supplied to the phase comparing circuit 11. The phase comparing circuit 11 phase-compares a pilot signal Sp contained in the signal Sc and the signal Sd, and supplies the phase-compared output through a low-pass filter 12 to the VCO 13 as the control signal for the latter. Accordingly, in the stable state of the PLL circuit 10, the signal So is a sine wave signal having the frequency f and which is synchronized with the pilot signal Sp.

The signal So is supplied to the multiplying circuit 8 and is there multiplied by the signal Sc. By this multiplication, the signal Sc is demodulated, as hereinafter described in detail, to provide left and right channel signals L and R. The signals L and R are supplied to terminals 100L and 100R via low-pass filters 9L and 9R, respectively, for deemphasizing and which are used to remove unnecessary high band components.

Simultaneously, a portion of the signal So supplied to the multiplying circuit 8 is supplied to a level detecting circuit 21 which detects the level of the signal So. The resulting detected signal St is supplied from the detecting circuit 21 through a low-pass filter 22 to the VCO 13 as a control signal for controlling the magnitude of its oscillation. Therefore, the signal So is controlled to have a predetermined constant level.

The signal Sr from the limiter 15 is also supplied to a frequency dividing circuit (or divide-by-2 circuit) 31, in which it is divided to provide a rectangular wave signal Sb which inverts its polarity in response to each trailing edge of the signal Sr. Therefore, the signal Sb has the same frequency f/2 as the signal Sd and is delayed in phase from the signal Sd by 90 degrees. The signal Sb is supplied to a comparing circuit 32, and the signal Sc from the demodulating circuit 7 is also supplied to the comparing circuit 32.

In the example being described, between the pilot signal Sp in the signal Sc and the signal Sd there is a phase difference of 90 degrees maintained by the PLL circuit 10. The signal Sb also has a phase difference of 90 degrees relative to the signal Sd. Accordingly, when the received FM broadcast is in the stereo mode, the signal Sp in the signal Sc and the signal Sb are of the same phase so that the comparing circuit 32 generates a compared output having the level "1". When the FM broadcast is a monaural broadcast, the demodulating circuit 7 generates the output signal (L+R) and no pilot signal Sp is supplied to the comparing circuit 32 which accordingly provides a random noise as its output.

The compared output of the comparing circuit 32 is supplied to a low-pass filter 33 which derives a signal which is "1" in the stereo broadcast mode and "0" in the monaural broadcast mode. This signal "1" or "0" is supplied to a suitable displaying device, such as, a light emitting diode (LED) 34 or the like, thereby providing a stereo/monaural indication.

Figure 2:
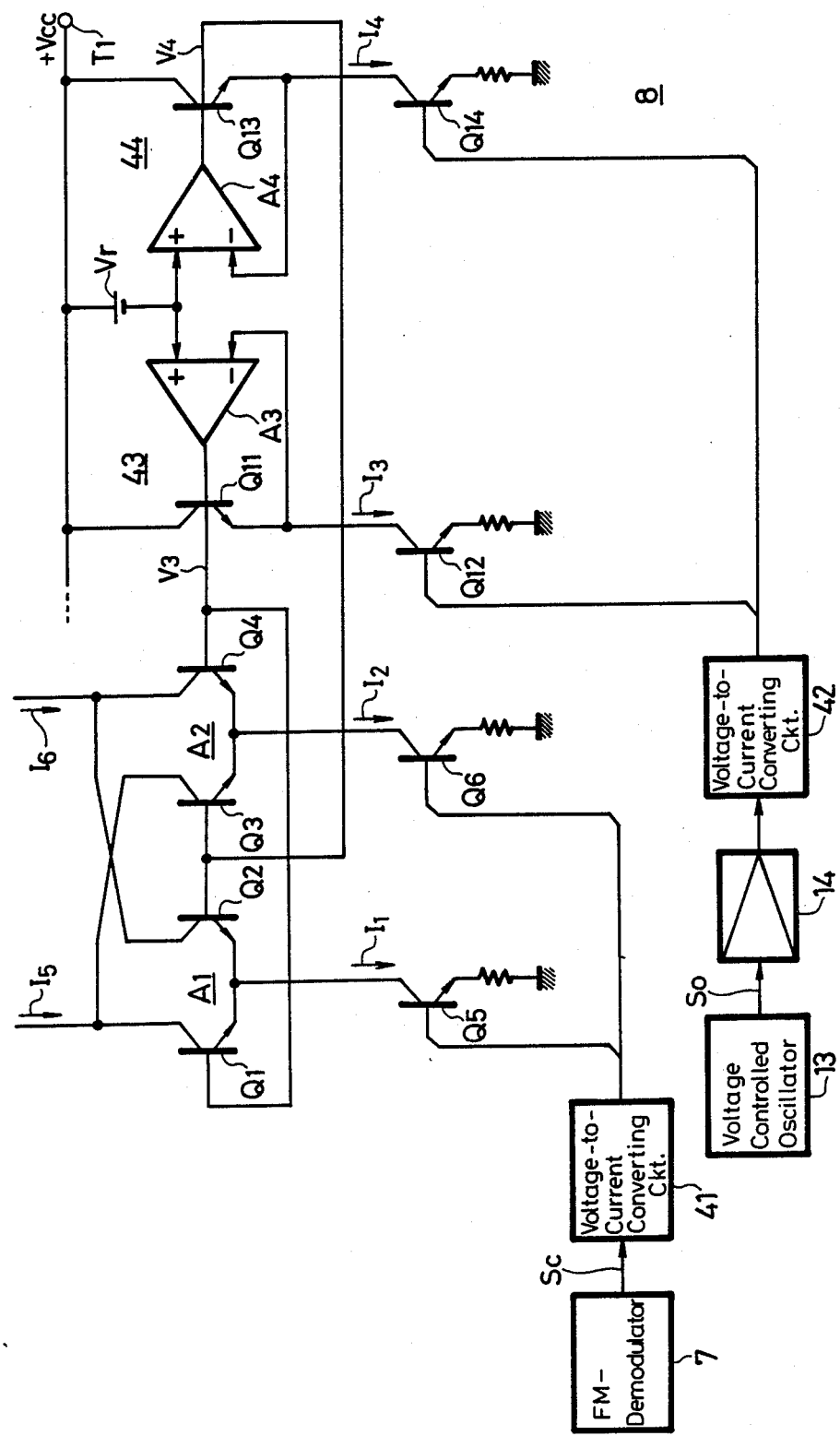
FIG. 2 is a schematic block diagram more fully showing a multiplying circuit included in the demodulator of FIG. 1.

Referring now to FIG. 2, it will be seen that, in an example of the multiplying circuit 8 of FIG. 1, the collector-emitter path of a constant current source transistor Q5 is connected between ground and the connected together emitters of transistors Q1 and Q2 which constitute a differential amplifier A1. Further, the collector-emitter path of a constant current source transistor Q6 is connected between ground and the connected together emitters of transistors Q3 and Q4 which constitute a differential amplifier A2. The collectors of transistors Q1 and Q3 are connected together and the collectors of transistors Q2 and Q4 are connected together to form a pair of output terminals The composite stereo signal Sc from the demodulating circuit 7 is supplied to a voltage-to-current converting circuit 41 in which the signal Sc is converted to a pair of balanced-type signal currents The resultant signal currents are supplied to the bases of transistors Q5 and Q6 so that the transistors Q5 and Q6 are supplied, at their collectors, with currents $I_1$ and $I_2$, respectively, corresponding to the signal Sc. The currents $I_1$ and $I_2$ are expressed by the following equations:

$$I_1 = I_x + (L+R) + (L-R)\sin\omega t$$
$$= I_x + Im + Is \sin\omega t \qquad \ldots (1)$$

$$I_2 = I_x - \gamma(Im + Is \sin\omega t) \qquad \ldots (2)$$

where $I_x$ is the direct current component, $Im$ is $L+R$, $Is$ is $L-R$ and $\gamma$ is a predetermined constant. In the above equations (1) and (2), a current component corresponding to the pilot signal Sp is neglected for the sake of simplicity.

Continuing with the description of the circuit shown on FIG. 2, it will be seen that an amplifier A3 and transistors Q11 and Q12 are connected to constitute a current-to-voltage converting circuit 43 having a logarithmic compression characteristic. More specifically, an output terminal of the amplifier A3 is connected to the base of the transistor Q11 whose collector is connected to a power source terminal T1. The emitter of the transistor Q11 is connected to an inverting input terminal of the amplifier A3 and a bias voltage source Vr is connected between the non-inverting input terminal of the amplifier A3 and the terminal T1. Furthermore, the collector-emitter path of the transistor Q12 is connected between the emitter of the transistor Q11 and the ground.

An amplifier A4 and transistors Q13 and Q14 are shown to be similarly connected to constitute a current-to-voltage converting circuit 44 having a logarithmic compression characteristic.

The oscillation signal So from the VCO 13 is supplied through the buffer amplifier 14 to a voltage-to-current converting circuit 42, in which it is converted to a pair of balanced-type signal currents supplied to the bases of transistors Q12 and Q14, and the transistors Q12 and Q14 are supplied at their collectors with currents $I_3$ and $I_4$ corresponding to the signal So. The currents $I_3$ and $I_4$ are expressed by the following equations:

$$I_3 = (1 + A \sin \omega t) I_y \quad \ldots (3)$$

$$I_4 = (1 - A \sin \omega t) I_y \quad \ldots (4)$$

where A is the ratio of alternating current components to direct current components of the currents $I_3$ and $I_4$ and is determined so as to satisfy $0 < A \leq 1$.

The output terminal of the amplifier A3 is also connected to the bases of the transistors Q1 and Q4 and the output terminal of the amplifier A4 is also connected to the bases of the transistors Q2 and Q3. In the circuit of FIG. 2, the corresponding transistors are arranged to have the same or similar characteristics.

It will be appreciated that the currents $I_3$ and $I_4$ are also emitter currents from the transistors Q11 and Q13, respectively, so that the transistors Q11 and Q13 generate, at their base-emitter paths, a pair of voltages $V_3$ and $V_4$ which are current-to-voltage-converted from the currents $I_3$ and $I_4$ and which are compressed from a logarithmic standpoint.

The voltages $V_3$ and $V_4$ thus logarithmic-compressed are respectively supplied to the bases of the transistors Q1, Q4 and to the bases of the transistors Q2, Q3 so that the collector currents of the transistors Q1, Q4 and of the transistors Q2, Q3 are linearly changed in accordance with the currents $I_3$ and $I_4$, respectively.

The collector currents of the transistors Q1, Q2 and of the transistors Q3, Q4 are also changed linearly in response to their emitter currents $I_1$ and $I_2$, respectively, so that the transistors Q1, Q2 and Q3, Q4 generate at their collectors a pair of linear multiplied output currents $I_5$ and $I_6$, respectively. Such currents $I_5$ and $I_6$ are stereo demodulated outputs, or signal currents corresponding to the signals L and R.

More specifically, the currents $I_1$, $I_2$ are changed in accordance with the currents $I_3$, $I_4$ so that if the ratio (multiplication gain) in which the $I_5$ and $I_6$ are changed in accordance with the currents $I_3$ and $I_4$ is, for the sake of simplicity, selected to be one multiple, the following equations are established:

Starting from $$I_3 = (1 + A \sin \omega t) I_y \quad \ldots (3)$$

$$I_4 = (1 - A \sin \omega t) I_y \quad \ldots (4)$$

the currents $I_5$ and $I_6$ become:

$$I_5 = \tfrac{1}{2}(1 + A \sin \omega t) I_1 + \tfrac{1}{2}(1 - A \sin \omega t) I_2 \quad \ldots (5)$$

$$I_6 = \tfrac{1}{2}(1 - A \sin \omega t) I_1 + \tfrac{1}{2}(1 + A \sin \omega t) I_2 \quad \ldots (6)$$

The above equations (5) and (6) lead to $$\begin{aligned}
2I_5 &= (1 + A\sin\omega t)I_1 + (1 - A\sin\omega t)I_2 \quad (7)\\
&= (1 + A\sin\omega t)(I_x + Im + Is\sin\omega t) +\\
&\quad (1 - A\sin\omega t)\{I_x - \gamma(Im + Is\sin\omega t)\}\\
&= (1 + A\sin\omega t)I_x + (1 + A\sin\omega t)(Im + Is\sin\omega t) +\\
&\quad (1 - A\sin\omega t)I_x - \gamma(1 - A\sin\omega t)(Im + Is\sin\omega t)\\
&= 2I_x + (1 - \gamma)(Im + Is\sin\omega t) +\\
&\quad A\sin\omega t(1 + \gamma)(Im + Is\sin\omega t)\\
&= 2I_x + (1 - \gamma)(Im + Is\sin\omega t) +\\
&\quad Im(1 + \gamma)A\sin\omega t + Is(1 + \gamma)A\sin^2\omega t
\end{aligned}$$

-continued
$$\begin{aligned}
&= 2I_x + (1 - \gamma)(Im + Is\sin\omega t) +\\
&\quad Im(1 + \gamma)A\sin\omega t + Is(1 + \gamma)A(1 - \cos 2\omega t)/2
\end{aligned}$$

This current $I_5$ is supplied to the low-pass filter 9L (shown in FIG. 1) which removes its undesired high band component, so that the low-pass filter 9L provides an output current $I_L$ expressed as $$\begin{aligned}
2I_L &= 2I_x + (1 - \gamma)Im + A(1 + \gamma)Is/2 \quad (8)\\
\therefore I_L &= I_x + (1 - \gamma)(L + R)/2 +\\
&\quad A(1 + \gamma)(L - R)/4\\
&= I_x + \frac{2(1 - \gamma) + A(1 + \gamma)}{4} L +\\
&\quad \frac{2(1 - \gamma) - A(1 + \gamma)}{4} R
\end{aligned}$$

Similarly, an output current $I_R$ of the low-pass filter 9R is represented as $$\begin{aligned}
I_R = I_x &+ \frac{2(1 - \gamma) + A(1 + \gamma)}{4} R + \quad (9)\\
&\frac{2(1 - \gamma) - A(1 + \gamma)}{4} L
\end{aligned}$$

If the numerators of the third term in equations (8) and (9) for the currents $I_L$ and $I_R$ are zero, or if the following equation is established $$2(1 - \gamma) - A(1 + \gamma) = 0$$

$$\therefore A = 2(1 - \gamma)/(1 + \gamma), \text{ this yields}$$

$$I_L = I_x + (1 - \gamma)L \quad (10)$$

$$I_R = I_x + (1 - \gamma)R \quad (11)$$

It is thus possible to obtain the stereo demodulated outputs $I_L$ and $I_R$ without any cross-talk component. Further, these stereo demodulated outputs $I_L$ and $I_R$ do not contain a beat interference component.

It will be apparent from the foregoing that if the magnitude of the ratio "A" is changed, then the levels of crosstalk components in the demodulated outputs $I_L$ and $I_R$ are also changed. As earlier noted, the value "A" represents the ratio of the current of the signal $S_0$ relative to the direct current components in the currents $I_3$ and $I_4$. In other words, in the currents $I_3$ and $I_4$, the ratio "A" between the direct current components and the alternating current component $\sin \omega t$ has to be made constant. To this end, as described above, the level of the oscillation signal So is detected by the detecting circuit 21 and the level or amplitude of the oscillation signal So is controlled on the basis of the detected output from the detecting circuit 21.

Figure 3A:
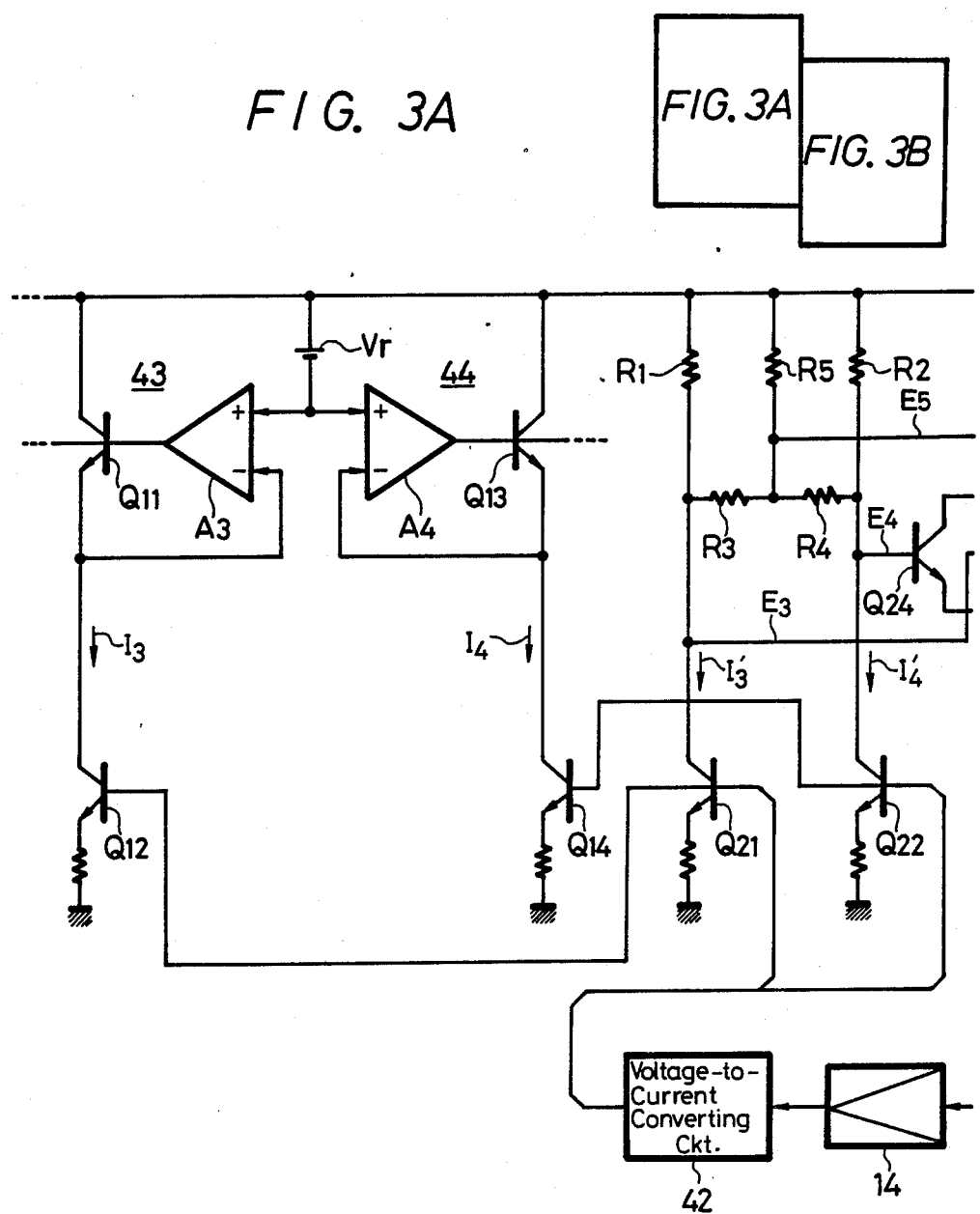
FIG. 3 (formed of FIGS. 3A and 3B to permit illustration on a relatively large scale) is a schematic diagram showing a detecting circuit and a voltage controlled oscillator that are desirably included in the embodiment of the present invention shown in FIG. 1.
Figure 3B:
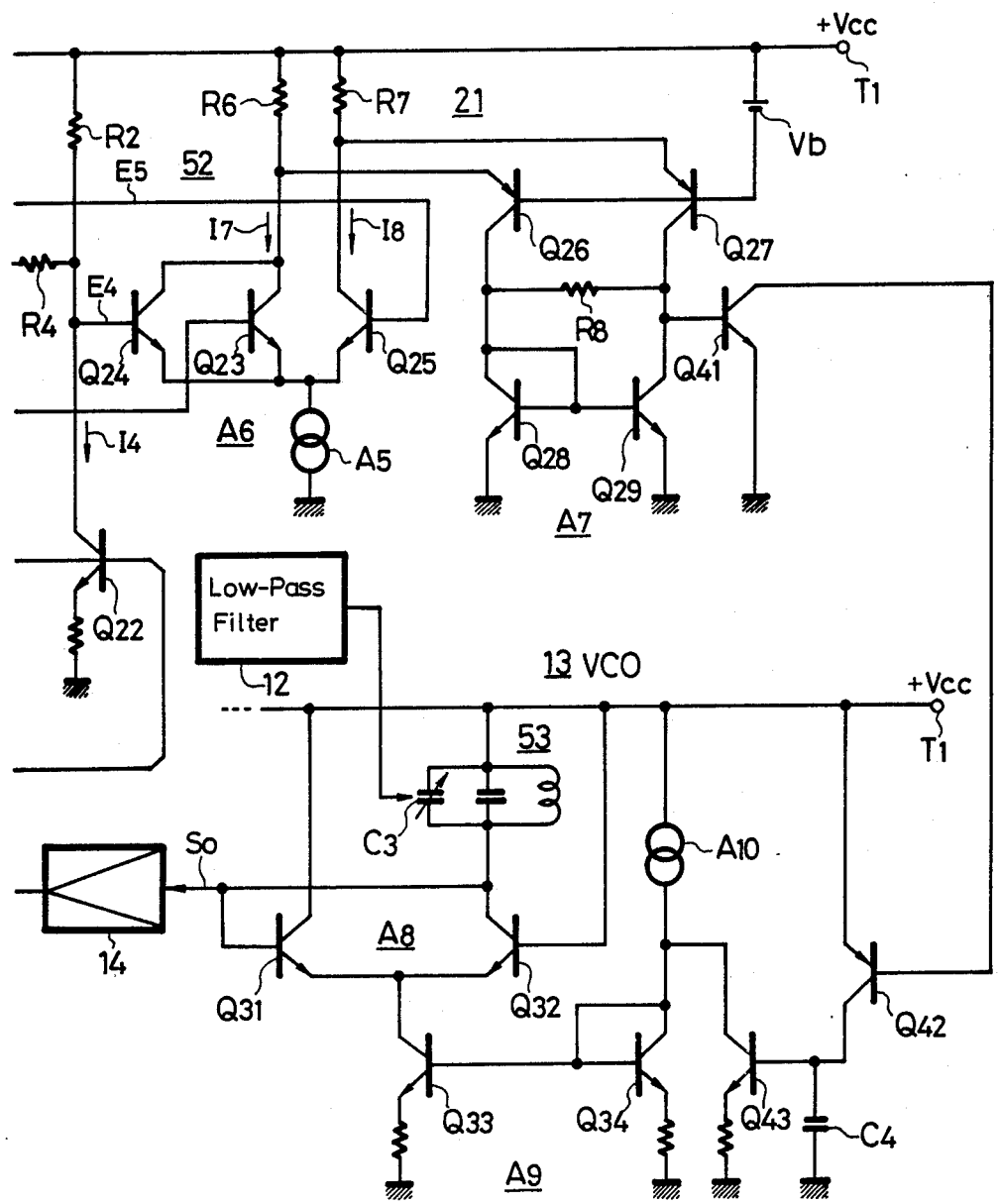

FIG. 3 (formed of FIGS. 3A and 3B together) illustrates specific examples of the detecting circuit 21 and the VCO 13 that may be used in the circuit of FIG. 1.

More specifically, in the detecting circuit 21 of FIG. 3, the bases of transistors Q21 and Q22 are respectively connected to the bases of transistors Q12 and Q14 and the emitters thereof are grounded. Resistors R1 and R2 having equal resistance values are connected between the collectors of the transistors Q21 and Q22, respectively, and the terminal T1. Resistors R3 and R4 also having equal resistance values are serially connected between the collectors of the transistors Q21 and Q22, and a resistor R5 is connected between the junction point of the resistors R3 and R4 and the terminal T1.

The emitters of transistors Q23 and Q25 are connected together to a constant current source A5 which has the ground as its reference potential point. Resistors R6 and R7 which have equal resistance values are connected between the collectors of the transistors Q23 and Q25, respectively, and the terminal T1, thereby providing a differential amplifier A6. Also, the collector-emitter path of a transistor Q24 is connected in parallel to the collector-emitter path of the transistor Q23 so as to form a full-wave rectifying circuit 52 of a differential amplifier circuit arrangement. The bases of the transistors Q23 and Q24 are connected to the collectors of the transistors Q21 and Q22, and the base of the transistor Q25 is connected to the junction point of the resistors R3 to R5.

A bias voltage $V_b$ is applied to the bases of transistors Q26 and Q27 with the voltage of the terminal T1 being taken as the reference potential point so that the transistors Q26 and Q27 are base-grounded. The emitters of the transistors Q26 and Q27 are connected to the collectors of the transistors Q23 and Q25, respectively, and the collectors of the transistors Q26 and Q27 are connected to the collectors of transistors Q28 and Q29, respectively. The transistors Q28 and Q29 constitute a current mirror circuit A7 in which the transistor Q28 is made the input side and the reference potential point is the ground. A resistor R8 is connected between the collectors of the transistors Q26 and Q27 for adjusting the current gain of the current mirror circuit A7. The output currents of the detecting circuit 21 are derived from the connected together collectors of the transistors Q27 and Q29.

In the VCO 13 shown on FIG. 3, the collector-emitter path of a constant current source transistor Q33 is connected between the connected together emitters of transistors Q31 and Q32 and the ground, thereby to provide a differential amplifier A8. The collector of transistor Q31 is connected to the terminal T1, and the base of transistor 31 is connected to the collector of the transistor Q32. A parallel resonant circuit 53 is connected between the collector of the transistor Q32 and the terminal T1, and the base of the transistor Q32 is connected to the terminal T1. The transistor Q32 generates, at its collector, the oscillation signal So which is then fed through the buffer amplifier 14 to the converting circuit 42. To the resonant circuit 53, there is connected an equivalent variable capacitor C3 which utilizes, for example, a Miller effect. The output voltage of the low-pass filter 12 is supplied to the variable capacitor C3 as the control voltage for the latter.

The transistor Q33 forms a current mirror circuit A9 in which the transistor Q33 is the input side transistor and the reference potential point is grounded. Further, the collector of a transistor Q34 is connected with a constant current source A10 in which the terminal T1 is used as the reference potential point.

The collectors of the transistors Q27 and Q29 are connected together to the base of a transistor Q41 which has its collector connected to the base of a transistor Q42 whose emitter is connected to the terminal T1. A capacitor C4 is connected between the collector of the transistor Q42 and the ground. The collector of the transistor Q42 is further connected to the base of a transistor Q43 whose emitter is grounded. The collector of the transistor Q43 is connected to the collector of the transistor Q34.

In the above-described arrangement, the transistors Q21 and Q22 are respectively supplied at their collectors with currents $I'_3$ and $I'_4$ proportional to the currents $I_3$ and $I_4$ from the collectors of the transistors Q12 and Q14, for example, the currents $I'_3$ and $I'_4$ may be of the same magnitude as currents $I_3$ and $I_4$, respectively, whereby voltages $E_3$ and $E_4$ linearly proportional to the currents $I_3$ and $I_4$ are obtained at the collectors of the transistors Q21 and Q22 by the resistors R1 and R2. At that time, there are established the equations $$I_3 = (1+A \sin \omega t)I_y \qquad \ldots (3)$$

$$I_4 = (1-A \sin \omega t)I_y \qquad \ldots (4)$$

Thus, as shown in FIG. 4, the voltages $E_3$ and $E_4$ have a direct current component $E_0$ and alternating current components e which are opposite to each other in phase. The direct current component $E_0$ is expressed as $$E_0 = I_y R1(R3+2R5)/(R1+R3+2R5 \qquad \ldots (12)$$

Further, since the alternating current components e of the voltages $E_3$ and $E_4$ are opposite to each other in phase, only the direct current components of the voltages $E_3$ and $E_4$, divided by the resistors R3 to R5, are developed at the junction point of the resistors R3 to R5, and the resultant direct current voltage $E_5$ is expressed as $$E_5 = 2I_y R1 R5/(R1+R3+2R5) \qquad \ldots (13)$$

The above-mentioned direct current voltage $E_5$ is supplied to the base of the transistor Q25 and the voltages $E_3$ and $E_4$ are supplied to the bases of the transistors Q23 and Q24 so that, as shown in FIG. 4, the voltages $E_3$ and $E_4$ are compared with the voltage $E_5$. Thus, the differential amplifier A6 generates the portions of the voltages $E_3$ and $E_4$ greater than the voltage $E_5$, that is, $$E_3 > E_5 \text{ and } E_4 > E_5.$$

Further, when the oscillation level of the VCO 13 is larger than a predetermined level, the alternating current components of the currents $I_3$ and $I_4$ are large. Accordingly, $E_3 (E_4) > E_5$ is satisfied near the positive peak points of the voltages $E_3$ and $E_4$ with the result that a collector current $I_7$, which is the sum of the collector currents of the transistors Q23 and Q24, becomes larger than the collector current $I_8$ of the transistor Q25. As a result, the emitter current of the transistor Q26 is decreased and the emitter current of the transistor Q27 is increased. In such case, the emitter current of the transistor Q26 is made equal to the collector current of the transistor Q29 by the current mirror circuit A7, whereby the collector current of the transistor Q29 is decreased. Hence, a current which is the difference between the collector current (large) of the transistor Q27 and the collector current (small) of the transistor Q29 is supplied to the base of the transistor Q41.

Consequently, the collector current of the transistor Q41 is increased and the collector current of the transistor Q42 is also increased, whereby the collector current of the transistor Q43 is increased, thereby decreasing the collector current of the transistor Q34. Thus, the collector current of the transistor Q33 is decreased for decreasing the oscillation level of the VCO 13.

Since the voltages $E_3$ and $E_4$ contain the alternating current component e having the frequency f, the currents of the respective portions, which are the results of comparing the voltages $E_3$ and $E_4$ with the voltage $E_4$, are intermittently generated at the period of frequency 2f. In this case, the collector current of the transistor Q42 is smoothed by a capacitor $C_4$ so that the collector currents flowing to the transistors Q43, Q34 and Q33, respectively, become direct currents with the levels thereof corresponding to the results of comparing the voltages $E_3$, $E_4$ with the voltage $E_5$.

When the oscillation level of the VCO 13 is less than the predetermined level, that is, $E_3(E_4) < E_5$ even at the positive peak points of the voltages $E_3$ and $E_4$, the relation $I_7 < I_8$ is established. Thus, the collector current of the transistor Q27 is decreased while the collector current of the transistor Q26 is increased, thereby increasing the collector current of the transistor Q29. As a result, the base current of the transistor Q41 is reduced to zero, thereby turning off the transistor Q41.

Consequently, the transistor Q24 is turned off and the transistor Q43 is turned off, whereby the collector current of the transistor Q34 is increased to be a value determined by the constant current source A10, and the collector current of the transistor Q33 is increased similarly. As a result of the foregoing, the oscillation level of the VCO 13 is increased.

If the loop gain of the control loop for the oscillation level is sufficiently large, the oscillation level of the VCO 13 is controlled so that the levels of the voltages $E_3$ and $E_4$ at the positive peak points are equal to the level of the voltage $E_5$, as shown in FIG. 4. The oscillation is thereby stabilized at that oscillation level.

At that time, and as is apparent from FIG. 4, $$e = E_0 - E_5 \qquad \ldots (14)$$

Substituting the expressions for $E_0$ and $E_5$ from equations (12) and (13), the above equation (14) yields:

$$\begin{aligned} e &= I_y R1(R3 + 2R5)/(R1 + R3 + 2R5) \\ &\quad - 2I_y R1 R5/(R1 + R3 + 2R5) \\ &= I_y R1 R3/(R1 + R3 + 2R5) \end{aligned} \qquad (15)$$

Consequently, the ratio A is expressed as

A = alternating current components of $I_3$, $I_4$/direct current components of the currents $I_3$ and $I_4$ $$\begin{aligned} A &= e/\{(R1//R3)I_y\} \\ &= \frac{I_y R1 R3/(R1 + R3 + 2R5)}{I_y R1 R3/(R1 + R3)} \\ &= (R1 + R3)/(R1 + R3 + 2R5) \\ &= \frac{1}{1 + 2R5/(R1 + R3)} \end{aligned} \qquad (16)$$

As described above, the ratio A is determined by the resistance R5 and the ratio of (R1+R3). When the circuit is fabricated as an integrated circuit (IC), the ratio of these resistors can be determined with high accuracy.

Thus, when the above-mentioned circuit is fabricated as an integrated circuit, the ratio A becomes the predetermined value, whereby cross-talk components of the demodulated signals L and R (currents $I_L$ and $I_R$) can be positively removed.

As set forth above, in a stereo multiplex demodulator according to an embodiment of the present invention, since the sine wave signal So synchronized with the pilot signal Sp and having the frequency f is provided and this sine wave signal So and the composite stereo signal Sc are linearly multiplied to thereby demodulate the stereo signals, it is possible to avoid the appearance in the stereo demodulated outputs L and R of a beat interference component. Further, the circuits and the elements of the demodulator need not be adjusted for that purpose and, therefore, the stereo multiplex demodulator embodying this invention is excellently adapted for mass-production. Moreover, when the stereo multiplex demodulator embodying the present invention is fabricated as an integrated circuit (IC), it does not need any external terminal pins for adjusting the circuit or the elements thereof. Thus, the stereo multiplex demodulator embodying the present invention is ideally suited to be fabricated as an integrated circuit.

Furthermore, since the oscillation level of the VCO 13 is stabilized by a feedback control operation, it is possible to avoid the presence of cross-talk components in the stereo demodulated outputs L and R. In addition, adjustment for avoidance of cross-talk is not necessary so that the stereo multiplex demodulator embodying the present invention is thereby additional suited for mass-production and for fabrication as an integrated circuit.

Although a preferred embodiment of the invention has been described in detail herein with reference to the accompanying drawings, it is to be understood that the invention is not limited to that precise embodiment, and that many modifications and variations thereof could be effected by one with ordinary skill in the art without departing from the spirit and scope of the invention as defined by the appended claims.

What is claimed is:

1. A stereo multiplex demodulator for demodulating left and right channel audio signals from a stereo composite signal comprised of a modulated signal having a subcarrier frequency and being modulated by a signal which is the sum of said left and right channel audio signals and by a signal which is the difference between said left and right channel audio signals and a pilot signal synchronized with said modulated signal, said stereo multiplex demodulator comprising:
    phase-locked loop means for forming a sine wave signal synchronized with said pilot signal and having a frequency equal to said subcarrier frequency of said modulated signal; and
    multiplying means for multiplying said stereo composite signal and said sine wave signal so as to generate said left and right channel audio signals, said multiplying means including current-to-voltage converting means having a logarithmic compression characteristic.

2. A stereo multiplex demodulator according to claim 1; in which said phase-locked loop means includes a voltage controlled oscillator.

3. A stereo multiplex demodulator according to claim 1; in which said phase-locked loop means includes a voltage controlled oscillator generating said sine wave signal; and further comprising means for detecting the level of said sine wave signal and for correspondingly controlling said voltage controlled oscillator so as to maintain a predetermined constant level of said sine wave signal.

* * * * *